(12) United States Patent
Hsu et al.

(10) Patent No.: US 12,063,039 B2
(45) Date of Patent: Aug. 13, 2024

(54) REGISTER WITH DATA RETENTION

(71) Applicant: MEDIATEK INC., Hsinchu (TW)

(72) Inventors: Wei-Min Hsu, Hsinchu (TW); Jen-Hang Yang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/049,725

(22) Filed: Oct. 26, 2022

(65) Prior Publication Data

US 2023/0170881 A1 Jun. 1, 2023

Related U.S. Application Data (60) Provisional application No. 63/284,698, filed on Dec. 1, 2021.

(51) Int. Cl.
*H03K 3/037* (2006.01)
*H03K 3/012* (2006.01)
*H03K 19/0185* (2006.01)
*H03K 19/20* (2006.01)

(52) U.S. Cl.
CPC ........... *H03K 3/012* (2013.01); *H03K 3/0372* (2013.01); *H03K 19/018521* (2013.01); *H03K 19/20* (2013.01)

(58) Field of Classification Search
CPC ......... H03K 3/012; H03K 3/0372; H03K 3/356182; H03K 3/35625; H03K 3/0375; H03K 19/018521; H03K 19/356182
See application file for complete search history.

(56) References Cited

U.S. PATENT DOCUMENTS

| | | | | |
|---|---|---|---|---|
| 6,157,693 | A | * 12/2000 | Jayaraman | H03K 23/667 327/117 |
| 2010/0001774 | A1 | 1/2010 | Djaja et al. | |
| 2013/0064019 | A1 | 3/2013 | Frederick, Jr. | |
| 2018/0248541 | A1* | 8/2018 | Purushothaman | H03K 3/35625 |
| 2018/0300208 | A1* | 10/2018 | Oruganti | G06F 3/0683 |
| 2019/0305761 | A1* | 10/2019 | Huang | H03K 3/35625 |
| 2020/0212896 | A1 | 7/2020 | Purushothaman et al. | |
| 2020/0252058 | A1* | 8/2020 | Hiraga | H03K 3/356 |

FOREIGN PATENT DOCUMENTS

EP 2 104 108 A1 9/2009

OTHER PUBLICATIONS

Extended European Search Report dated Apr. 25, 2023, issued in application No. EP 22210029.9.
Chinese language office action dated Apr. 17, 2024, issued in application No. TW 111145867.

* cited by examiner

*Primary Examiner* — Sibin Chen
(74) *Attorney, Agent, or Firm* — McClure, Qualey & Rodack, LLP (57) ABSTRACT

A register with data retention includes a master-slave flip-flop, a balloon latch, and a level shifter. The master-slave flip-flop is supplied by a first power voltage. The balloon latch is supplied by a second power voltage. The second power voltage is independent of the first power voltage. The level shifter provides a voltage conversion between the master-slave flip-flop and the balloon latch. A data is stored in the master-slave flip-flop. When the first power voltage is disabled, the balloon latch is configured to temporarily retain the data.

20 Claims, 6 Drawing Sheets

REGISTER WITH DATA RETENTION

CROSS REFERENCE TO RELATED APPLICATIONS

This application claims the benefit of U.S. Provisional Application No. 63/284,698, filed on Dec. 1, 2021, the entirety of which is incorporated by reference herein.

BACKGROUND OF THE INVENTION

Field of the Invention

The disclosure generally relates to a register, and more specifically, to a register with data retention.

Description of the Related Art

All of the latches in a register with a conventional design are supplied by the same power source. If the power source is turned off, the register cannot retain data. However, the power consumption of a conventional register may be too high. Accordingly, there is a need to propose a novel solution for solving the problems of the prior art.

BRIEF SUMMARY OF THE INVENTION

In an exemplary embodiment, the disclosure is directed to a register with data retention. The register includes a master-slave flip-flop, a balloon latch, and a level shifter. The master-slave flip-flop is supplied by a first power voltage. The balloon latch is supplied by a second power voltage. The second power voltage is independent of the first power voltage. The level shifter provides a voltage conversion between the master-slave flip-flop and the balloon latch. A data is stored in the master-slave flip-flop. When the first power voltage is disabled, the balloon latch is configured to temporarily retain the data.

In some embodiments, the second power voltage is always enabled.

In some embodiments, the register operates in a normal mode, a saving mode, or a restoring mode.

In some embodiments, in the saving mode, the data is written into the balloon latch.

In some embodiments, in the restoring mode, the data is read out from the balloon latch.

In some embodiments, the first power voltage is temporarily disabled after the saving mode and before the restoring mode.

In some embodiments, the level shifter is a cross-coupling type level shifter or a current-mirror type level shifter.

In some embodiments, the balloon latch includes a first transmission gate and a second transmission gate. The first transmission gate may be open or closed, according to a restoring voltage. The first transmission gate has a first terminal coupled to a first common node, and a second terminal coupled to a second common node. The second transmission gate may be open or closed, according to an inverted restoring voltage. The second transmission gate has a first terminal coupled to the first common node, and a second terminal coupled to a first node.

In some embodiments, the balloon latch further includes a first inverter, a second inverter, a third transmission gate, and a fourth transmission gate. The first inverter has an input terminal coupled to the first node, and an output terminal coupled to a second node. The third transmission gate may be open or closed, according to an inverted saving voltage. The third transmission gate has a first terminal coupled to the second node, and a second terminal coupled to a third node. The second inverter has an input terminal coupled to the third node, and an output terminal coupled to the first node. The fourth transmission gate may be open or closed, according to a saving voltage. The fourth transmission gate has a first terminal coupled to the third node, and a second terminal coupled to a fourth node.

In some embodiments, the balloon latch further includes a third inverter. The third inverter has an input terminal coupled to a fifth node, and an output terminal coupled to the fourth node.

In some embodiments, the level shifter includes a first P-type transistor, a second P-type transistor, a third P-type transistor, a fourth P-type transistor, a first N-type transistor, and a second N-type transistor. The first P-type transistor has a control terminal coupled to a sixth node, a first terminal coupled to the second power voltage, and a second terminal coupled to a seventh node. The second P-type transistor has a control terminal coupled to the fifth node, a first terminal coupled to the second power voltage, and a second terminal coupled to an eighth node. The third P-type transistor has a control terminal for receiving the shifting voltage, a first terminal coupled to the seventh node, and a second terminal coupled to the fifth node. The fourth P-type transistor has a control terminal for receiving the inverted shifting voltage, a first terminal coupled to the eighth node, and a second terminal coupled to the sixth node. The first N-type transistor has a control terminal for receiving the shifting voltage, a first terminal coupled to a ground voltage, and a second terminal coupled to the fifth node. The second N-type transistor has a control terminal for receiving the inverted shifting voltage, a first terminal coupled to the ground voltage, and a second terminal coupled to the sixth node.

In some embodiments, the level shifter includes a first P-type transistor, a second P-type transistor, a third P-type transistor, a fourth P-type transistor, a first N-type transistor, and a second N-type transistor. The first P-type transistor has a control terminal coupled to a fifth node, a first terminal coupled to the second power voltage, and a second terminal coupled to a sixth node. The second P-type transistor has a control terminal coupled to the fourth node, a first terminal coupled to the second power voltage, and a second terminal coupled to a seventh node. The third P-type transistor has a control terminal coupled to an eighth node, a first terminal coupled to the sixth node, and a second terminal coupled to the fourth node. The fourth P-type transistor has a control terminal coupled to a connection node, a first terminal coupled to the seventh node, and a second terminal coupled to the fifth node. The first N-type transistor has a control terminal coupled to the eighth node, a first terminal coupled to a ground voltage, and a second terminal coupled to the fourth node. The second N-type transistor has a control terminal coupled to the connection node, a first terminal coupled to the ground voltage, and a second terminal coupled to the fifth node.

In some embodiments, the register further includes an auxiliary circuit coupled to the level shifter. The auxiliary circuit selectively pulls up the voltage at the eighth node to the second power voltage.

In some embodiments, the auxiliary circuit includes a control transistor, a third inverter, and an auxiliary transmission gate. The control transistor has a control terminal for receiving an operational voltage, a first terminal coupled to the second power voltage, and a second terminal coupled to the eighth node. The third inverter has an input terminal coupled to the eighth node, and an output terminal coupled to the connection node. The auxiliary transmission gate may be open or closed, according to the saving voltage. The auxiliary transmission gate has a first terminal coupled to the eighth node, and a second terminal for receiving the inverted shifting voltage.

In some embodiments, the master-slave flip-flop includes a fourth inverter, a fifth inverter, a first control inverter, a fifth transmission gate, and a sixth transmission gate. The fourth inverter has an input terminal for receiving a data voltage, and an output terminal coupled to a ninth node. The fifth transmission gate may be open or closed, according to an inverted clock. The fifth transmission gate has a first terminal coupled to the ninth node, and a second terminal coupled to a tenth node. The first control inverter has an input terminal coupled to the tenth node, and an output terminal coupled to an eleventh node. The sixth transmission gate may be open or closed, according to a clock. The sixth transmission gate has a first terminal coupled to the tenth node, and a second terminal coupled to a twelfth node. The fifth inverter has an input terminal coupled to the eleventh node, and an output terminal coupled to the twelfth node.

In some embodiments, the master-slave flip-flop further includes a sixth inverter, a seventh inverter, a second control inverter, a seventh transmission gate, and an eighth transmission gate. The seventh transmission gate may be open or closed, according to the clock. The seventh transmission gate has a first terminal coupled to the eleventh node, and a second terminal coupled to a thirteenth node. The sixth inverter has an input terminal coupled to the thirteenth node for receiving the shifting voltage, and an output terminal coupled to the second common node for outputting the inverted shifting voltage. The eighth transmission gate may be open or closed, according to the inverted clock. The eighth transmission gate has a first terminal coupled to the thirteenth node, and a second terminal coupled to a fourteenth node. The second control inverter has an input terminal coupled to the first common node, and an output terminal coupled to the fourteenth node. The seventh inverter has an input terminal coupled to the second common node, and an output terminal for outputting an output voltage.

In some embodiments, the master-slave flip-flop includes a fourth inverter, a fifth inverter, a first NOR gate, a fifth transmission gate, and a sixth transmission gate. The fourth inverter has an input terminal for receiving a data voltage, and an output terminal coupled to a ninth node. The fifth transmission gate may be open or closed, according to an inverted clock. The fifth transmission gate has a first terminal coupled to the ninth node, and a second terminal coupled to a tenth node. The first NOR gate has a first input terminal for receiving a reset voltage, a second input terminal coupled to the tenth node, and an output terminal coupled to an eleventh node. The sixth transmission gate may be open or closed, according to a clock. The sixth transmission gate has a first terminal coupled to the tenth node, and a second terminal coupled to a twelfth node. The fifth inverter has an input terminal coupled to the eleventh node, and an output terminal coupled to the twelfth node.

In some embodiments, the master-slave flip-flop further includes a sixth inverter, a seventh inverter, a second NOR gate, a seventh transmission gate, and an eighth transmission gate. The seventh transmission gate may be open or closed, according to the clock. The seventh transmission gate has a first terminal coupled to the eleventh node, and a second terminal coupled to a thirteenth node. The sixth inverter has an input terminal coupled to the thirteenth node for receiving the shifting voltage, and an output terminal coupled to the second common node for outputting the inverted shifting voltage. The eighth transmission gate may be open or closed, according to the inverted clock. The eighth transmission gate has a first terminal coupled to the thirteenth node, and a second terminal coupled to a fourteenth node. The second NOR gate has a first input terminal coupled to the first common node, a second input terminal for receiving the reset voltage, and an output terminal coupled to the fourteenth node. The seventh inverter has an input terminal coupled to the second common node, and an output terminal for outputting an output voltage.

In some embodiments, the master-slave flip-flop includes a fourth inverter, a fifth inverter, a first NAND gate, a fifth transmission gate, and a sixth transmission gate. The fourth inverter has an input terminal for receiving a data voltage, and an output terminal coupled to a ninth node. The fifth transmission gate may be open or closed, according to an inverted clock. The fifth transmission gate has a first terminal coupled to the ninth node, and a second terminal coupled to a tenth node. The first NAND gate has a first input terminal for receiving a set voltage, a second input terminal coupled to the tenth node, and an output terminal coupled to an eleventh node. The sixth transmission gate may be open or closed, according to a clock. The sixth transmission gate has a first terminal coupled to the tenth node, and a second terminal coupled to a twelfth node. The fifth inverter has an input terminal coupled to the eleventh node, and an output terminal coupled to the twelfth node.

In some embodiments, the master-slave flip-flop further includes a sixth inverter, a seventh inverter, a second NAND gate, a seventh transmission gate, and an eighth transmission gate. The seventh transmission gate may be open or closed, according to the clock. The seventh transmission gate has a first terminal coupled to the eleventh node, and a second terminal coupled to a thirteenth node. The sixth inverter has an input terminal coupled to the thirteenth node for receiving the shifting voltage, and an output terminal coupled to the second common node for outputting the inverted shifting voltage. The eighth transmission gate may be open or closed, according to the inverted clock. The eighth transmission gate has a first terminal coupled to the thirteenth node, and a second terminal coupled to a fourteenth node. The second NAND gate has a first input terminal coupled to the first common node, a second input terminal for receiving the set voltage, and an output terminal coupled to the fourteenth node. The seventh inverter has an input terminal coupled to the second common node, and an output terminal for outputting an output voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
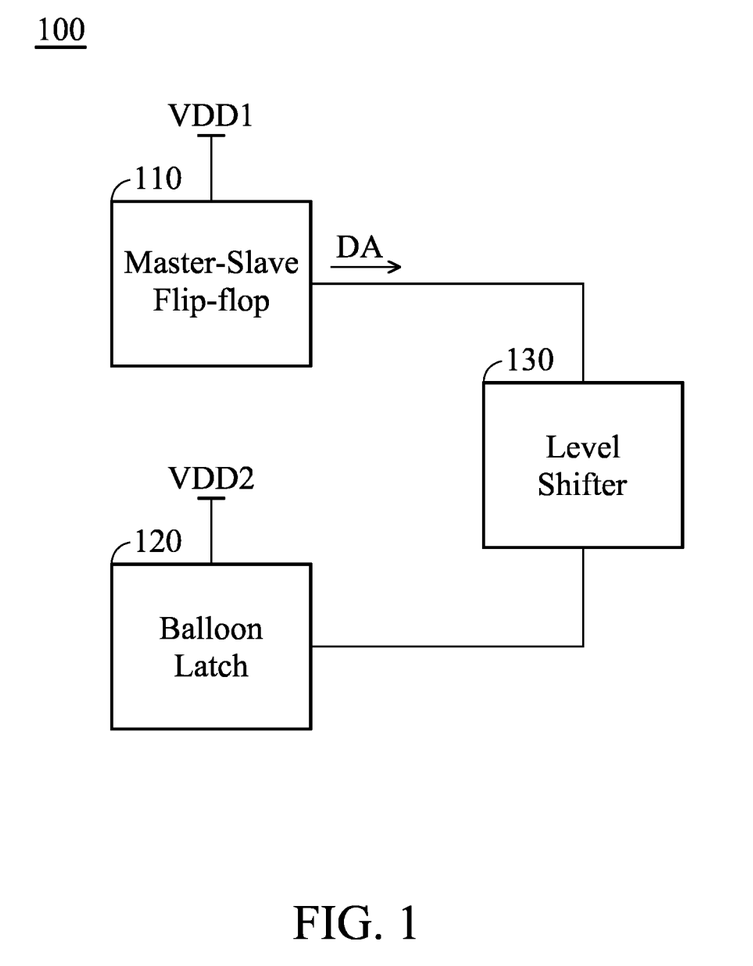
FIG. 1 is a diagram of a register according to an embodiment of the invention.

FIG. 1 is a diagram of a register 100 according to an embodiment of the invention. The register 100 may be applied to a mobile device, such as a smart phone, a tablet computer, or a notebook computer, but it is not limited thereto. As shown in FIG. 1, the register 100 includes a master-slave flip-flop 110, a balloon latch 120, and a level shifter 130. The master-slave flip-flop 110 is supplied by a first power voltage VDD1. The balloon latch 120 is supplied by a second power voltage VDD2. It should be noted that the second power voltage VDD2 is independent of the first power voltage VDD1. For example, the first power voltage VDD1 may be from a first power source, and the second power voltage VDD2 may be from a second power source. If the first power source is turned off, the first power voltage VDD1 will be disabled, but it will not negatively affect the second power voltage VDD2 from the second power source. In some embodiments, the second power voltage VDD2 is always enabled. The level shifter 130 provides a voltage conversion between the master-slave flip-flop 110 and the balloon latch 120. For example, the level shifter 130 may be a cross-coupling type level shifter or a current-mirror type level shifter.

A data DA is originally stored in the master-slave flip-flop 110. Generally, when the first power voltage VDD1 is disabled, the balloon latch 120 is configured to temporarily retain the data DA, and thus the data DA will not be lost. Specifically, the register 100 may operate in a normal mode, a saving mode, or a restoring mode. In the normal mode, the master-slave flip-flop 110 works normally. In the saving mode, the data DA can be read out from the master-slave flip-flop 110, and then the data DA can be written into the balloon latch 120. Conversely, in the restoring mode, the data DA can be read out from the balloon latch 120, and then the data DA can be written back into the master-slave flip-flop 110. For example, the first power voltage VDD1 may be temporarily disabled after the saving mode and before the restoring mode. Since the balloon latch 120 is supplied by the second power voltage VDD2, instead of the first power voltage VDD1, it can help to temporarily maintain the data DA for the master-slave flip-flop 110. In this design, the proposed register 100 not only provides the function of data retention but also reduces overall power consumption. In some embodiments, the register 100 is considered as a DRRTFF (Dual-Rail Retention Flip-Flip).

The following embodiments will introduce different configurations and detail structural features of the register 100. It should be understood that these figures and descriptions are merely exemplary, rather than limitations of the invention.

Figure 2:
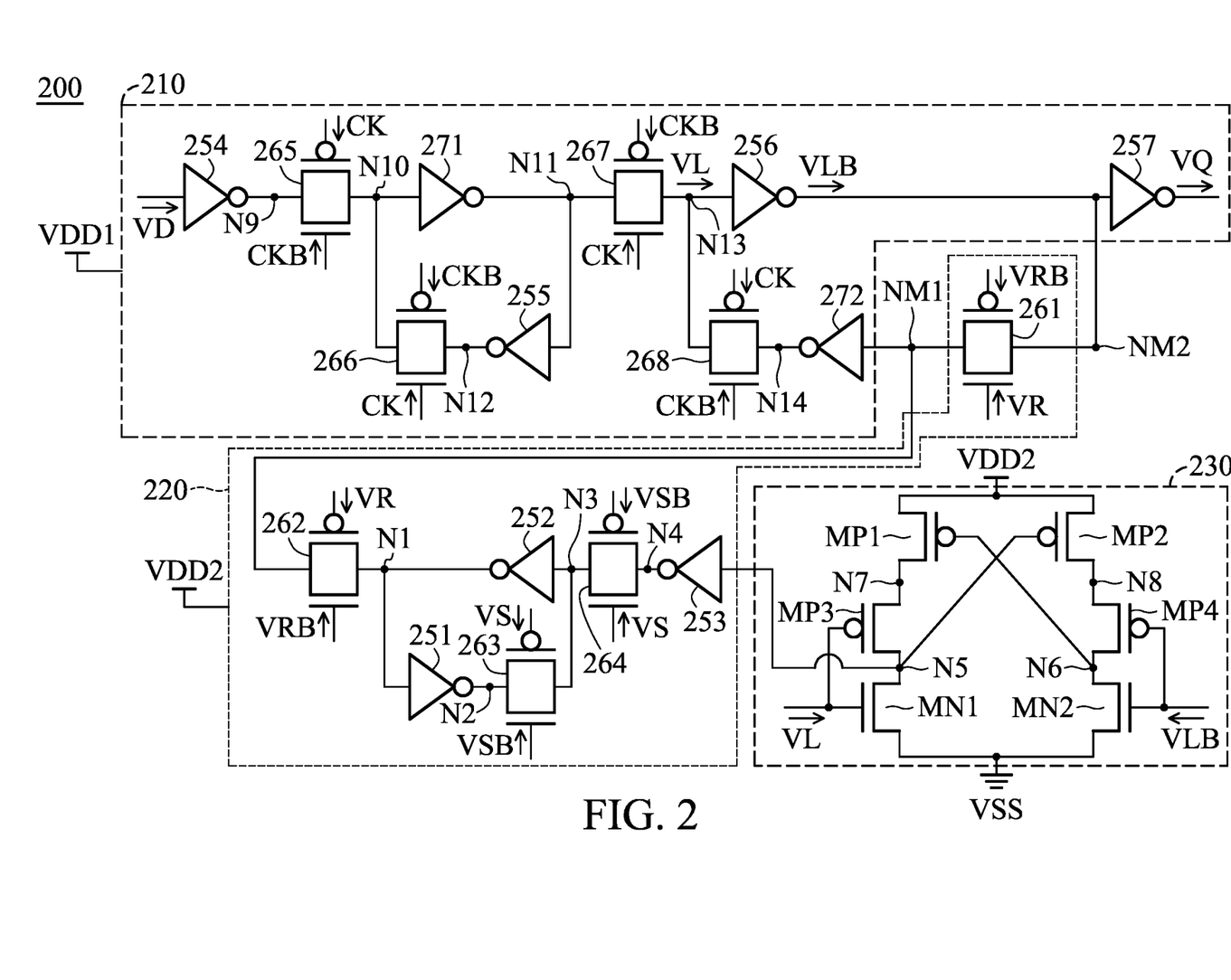
FIG. 2 is a circuit diagram of a register according to an embodiment of the invention.

FIG. 2 is a circuit diagram of a register 200 according to an embodiment of the invention. In the embodiment of FIG. 2, the register 200 includes a master-slave flip-flop 210, a balloon latch 220, and a level shifter 230. The master-slave flip-flop 210 is supplied by a first power voltage VDD1. The balloon latch 220 is supplied by a second power voltage VDD2. It should be noted that the second power voltage VDD2 is independent of the first power voltage VDD1. In some embodiments, a device supplied by the second power voltage VDD2 with a higher threshold voltage (e.g., HVT) and others are lower threshold voltages, for example: lower threshold voltage (LVT) or standard threshold voltage (SVT).

The balloon latch 220 includes a first inverter 251, a second inverter 252, a third inverter 253, a first transmission gate 261, a second transmission gate 262, a third transmission gate 263, and a fourth transmission gate 264. The first transmission gate 261 may be open or closed, according to a restoring voltage VR. The first transmission gate 261 has a first terminal coupled to a first common node NM1, and a second terminal coupled to a second common node NM2. The second transmission gate 262 may be open or closed, according to an inverted restoring voltage VRB. The second transmission gate 262 has a first terminal coupled to the first common node NM1, and a second terminal coupled to a first node N1. In some embodiments, the inverted restoring voltage VRB is generated by toggling the restoring voltage VR, and they have complementary logic levels.

For example, if a transmission gate is controlled according to a corresponding voltage, the transmission gate may be closed on the condition that the corresponding voltage has a high logic level (e.g., a logic "1"), and the transmission gate may be opened on the condition that the corresponding voltage has a low logic level (e.g., a logic "0"), but it is not limited thereto. Moreover, if the transmission gate is closed, its first terminal may be coupled to its second terminal. Conversely, if the transmission gate is opened, its first terminal may be decoupled from its second terminal.

The first inverter 251 has an input terminal coupled to the first node N1, and an output terminal coupled to a second node N2. The third transmission gate 263 may be open or closed, according to an inverted saving voltage VSB. The third transmission gate 263 has a first terminal coupled to the second node N2, and a second terminal coupled to a third node N3. The second inverter 252 has an input terminal coupled to the third node N3, and an output terminal coupled to the first node N1. The fourth transmission gate 264 may be open or closed, according to a saving voltage VS. The fourth transmission gate 264 has a first terminal coupled to the third node N3, and a second terminal coupled to a fourth node N4. The third inverter 253 has an input terminal coupled to a fifth node N5, and an output terminal coupled to the fourth node N4. In some embodiments, the inverted saving voltage VSB is generated by toggling the saving voltage VS, and they have complementary logic levels.

The level shifter 230 includes a first P-type transistor MP1, a second P-type transistor MP2, a third P-type transistor MP3, a fourth P-type transistor MP4, a first N-type transistor MN1, and a second N-type transistor MN2. For example, each P-type transistor may be a PMOS transistor (P-type Metal-Oxide-Semiconductor Field-Effect Transistor), and each N-type transistor may be an NMOS transistor (N-type Metal-Oxide-Semiconductor Field-Effect Transistor).

The first P-type transistor MP1 has a control terminal coupled to a sixth node N6, a first terminal coupled to the second power voltage VDD2, and a second terminal coupled to a seventh node N7. The second P-type transistor MP2 has a control terminal coupled to the fifth node N5, a first terminal coupled to the second power voltage VDD2, and a second terminal coupled to an eighth node N8. The third P-type transistor MP3 has a control terminal for receiving the shifting voltage VL, a first terminal coupled to the seventh node N7, and a second terminal coupled to the fifth node N5. The fourth P-type transistor MP4 has a control terminal for receiving the inverted shifting voltage VLB, a first terminal coupled to the eighth node N8, and a second terminal coupled to the sixth node N6. The first N-type transistor MN1 has a control terminal for receiving the shifting voltage VL, a first terminal coupled to a ground voltage VSS, and a second terminal coupled to the fifth node N5. The second N-type transistor MN2 has a control terminal for receiving the inverted shifting voltage VLB, a first terminal coupled to the ground voltage VSS, and a second terminal coupled to the sixth node N6. In some embodiments, the inverted shifting voltage VLB is generated by toggling the shifting voltage VL, and they have complementary logic levels.

The master-slave flip-flop 210 includes a fourth inverter 254, a fifth inverter 255, a sixth inverter 256, a seventh inverter 257, a fifth transmission gate 265, a sixth transmission gate 266, a seventh transmission gate 267, an eighth transmission gate 268, a first control inverter 271, and a second control inverter 272.

The fourth inverter 254 has an input terminal for receiving a data voltage VD, and an output terminal coupled to a ninth node N9. The fifth transmission gate 265 may be open or closed, according to an inverted clock CKB. The fifth transmission gate 265 has a first terminal coupled to the ninth node N9, and a second terminal coupled to a tenth node N10. The first control inverter 271 has an input terminal coupled to the tenth node N10, and an output terminal coupled to an eleventh node N11. The sixth transmission gate 266 may be open or closed, according to a clock CK. The sixth transmission gate 266 has a first terminal coupled to the tenth node N10, and a second terminal coupled to a twelfth node N12. The fifth inverter 255 has an input terminal coupled to the eleventh node N11, and an output terminal coupled to the twelfth node N12. In some embodiments, the inverted clock CKB is generated by toggling the clock CK, and they have complementary logic levels.

The seventh transmission gate 267 may be open or closed, according to the clock CK. The seventh transmission gate 267 has a first terminal coupled to the eleventh node N11, and a second terminal coupled to a thirteenth node N13. The sixth inverter 256 has an input terminal coupled to the thirteenth node N13 for receiving the shifting voltage VL, and an output terminal coupled to the second common node NM2 for outputting the inverted shifting voltage VLB. In some embodiments, the shifting voltage VL and the inverted shifting voltage VLB of the master-slave flip-flop 210 are also arranged for controlling the level shifter 230. The eighth transmission gate 268 may be open or closed, according to the inverted clock CKB. The eighth transmission gate 268 has a first terminal coupled to the thirteenth node N13, and a second terminal coupled to a fourteenth node N14. The second control inverter 272 has an input terminal coupled to the first common node NM1, and an output terminal coupled to the fourteenth node N14. The seventh inverter 257 has an input terminal coupled to the second common node NM2, and an output terminal for outputting an output voltage VQ. In some embodiments, any of the data voltage VD, the shifting voltage VL, and the output voltage VQ is considered the aforementioned data DA stored in the master-slave flip-flop 210.

Specifically, the register 200 may operate in a normal mode, a saving mode, or a restoring mode, which will be described in detail as follows.

In the normal mode, the saving voltage VS has a low logic level and the restoring voltage VR has a high logic level. Thus, the first transmission gate 261 and the third transmission gate 263 are both closed, and the second transmission gate 262 and the fourth transmission gate 264 are both opened. The master-slave flip-flop 210 is used as a normal flip-flop.

In the saving mode, the saving voltage VS and the restoring voltage VR each have a high logic level. Thus, the first transmission gate 261 and the fourth transmission gate 264 are both closed, and the second transmission gate 262 and the third transmission gate 263 are both opened. At the time, a data (e.g., the data voltage VD, the shifting voltage VL, or the output voltage VQ) can be read out from the master-slave flip-flop 210, and then the data can be written into the balloon latch 220. Furthermore, the level shifter 230 can provide a voltage conversion for the data between the first power voltage VDD1 and the second power voltage VDD2.

In the restoring mode, the saving voltage VS, the restoring voltage VR, and the clock CK each have a low logic level. Thus, the second transmission gate 262 and the third transmission gate 263 are both closed, and the first transmission gate 261 and the fourth transmission gate 264 are both opened. At the time, the data can be read out from balloon latch 220, and then the data can be written back into the master-slave flip-flop 210. As a result, the output voltage VQ of the master-slave flip-flop 210 can be completely recovered even if the first power voltage VDD1 is temporarily disabled (because the second power voltage VDD2 for the balloon latch 220 is always enabled).

Figure 3:
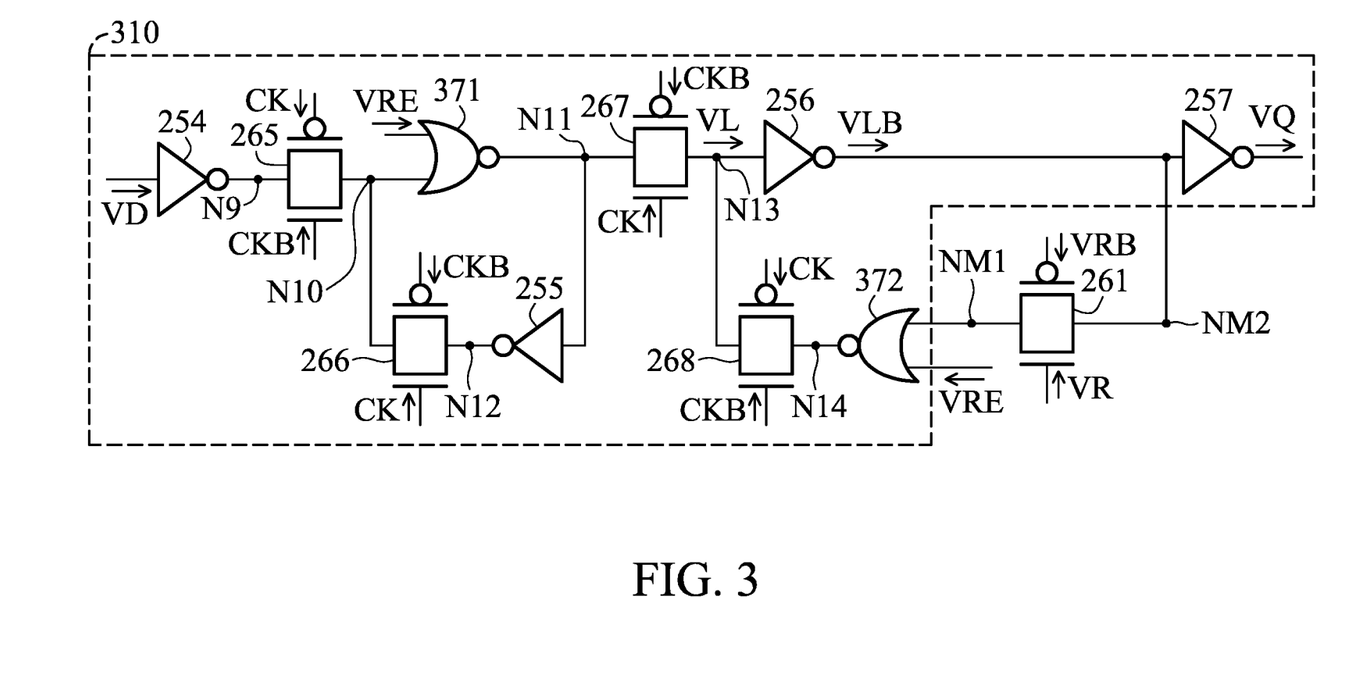
FIG. 3 is a circuit diagram of a master-slave flip-flop according to another embodiment of the invention.

FIG. 3 is a circuit diagram of a master-slave flip-flop 310 according to another embodiment of the invention. The master-slave flip-flop 310 with a positive reset function may be applied to the above register 200. In the embodiment of FIG. 3, the master-slave flip-flop 310 includes a first NOR gate 371 and a second NOR gate 372, instead of the first control inverter 271 and the second control inverter 272 as mentioned above. Specifically, the first NOR gate 371 has a first input terminal for receiving a reset voltage VRE, a second input terminal coupled to the tenth node N10, and an output terminal coupled to the eleventh node N11. The second NOR gate 372 has a first input terminal coupled to the first common node NM1, a second input terminal for receiving the reset voltage VRE, and an output terminal coupled to the fourteenth node N14. It should be noted that if the reset voltage VRE has a high logic level, the output voltage VQ can be forced and reset to a low logic level. Other features of the master-slave flip-flop 310 of FIG. 3 are similar to those of the master-slave flip-flop 210 of FIG. 2. Therefore, the two embodiments can achieve similar levels of performance.

Figure 4:
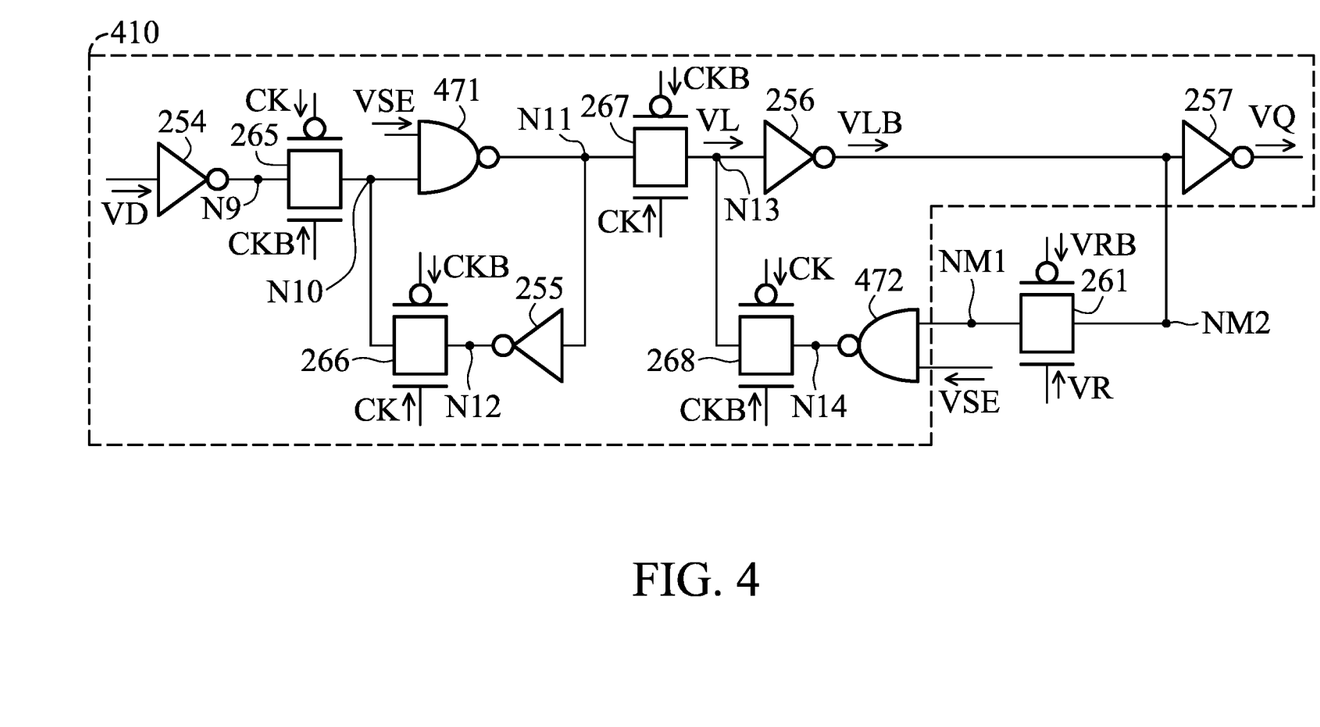
FIG. 4 is a circuit diagram of a master-slave flip-flop according to another embodiment of the invention.

FIG. 4 is a circuit diagram of a master-slave flip-flop 410 according to another embodiment of the invention. The master-slave flip-flop 410 with a negative set function may be applied to the above register 200. In the embodiment of FIG. 4, the master-slave flip-flop 410 includes a first NAND gate 471 and a second NAND gate 472, instead of the first control inverter 271 and the second control inverter 272 as mentioned above. Specifically, the first NAND gate 471 has a first input terminal for receiving a set voltage VSE, a second input terminal coupled to the tenth node N10, and an output terminal coupled to the eleventh node N11. The second NAND gate 472 has a first input terminal coupled to the first common node NM1, a second input terminal for receiving the set voltage VSE, and an output terminal coupled to the fourteenth node N14. It should be noted that if the set voltage VSE has a low logic level, the output voltage VQ can be forced and set to a high logic level. Other features of the master-slave flip-flop 410 of FIG. 4 are similar to those of the master-slave flip-flop 210 of FIG. 2. Therefore, the two embodiments can achieve similar levels of performance.

Figure 5:
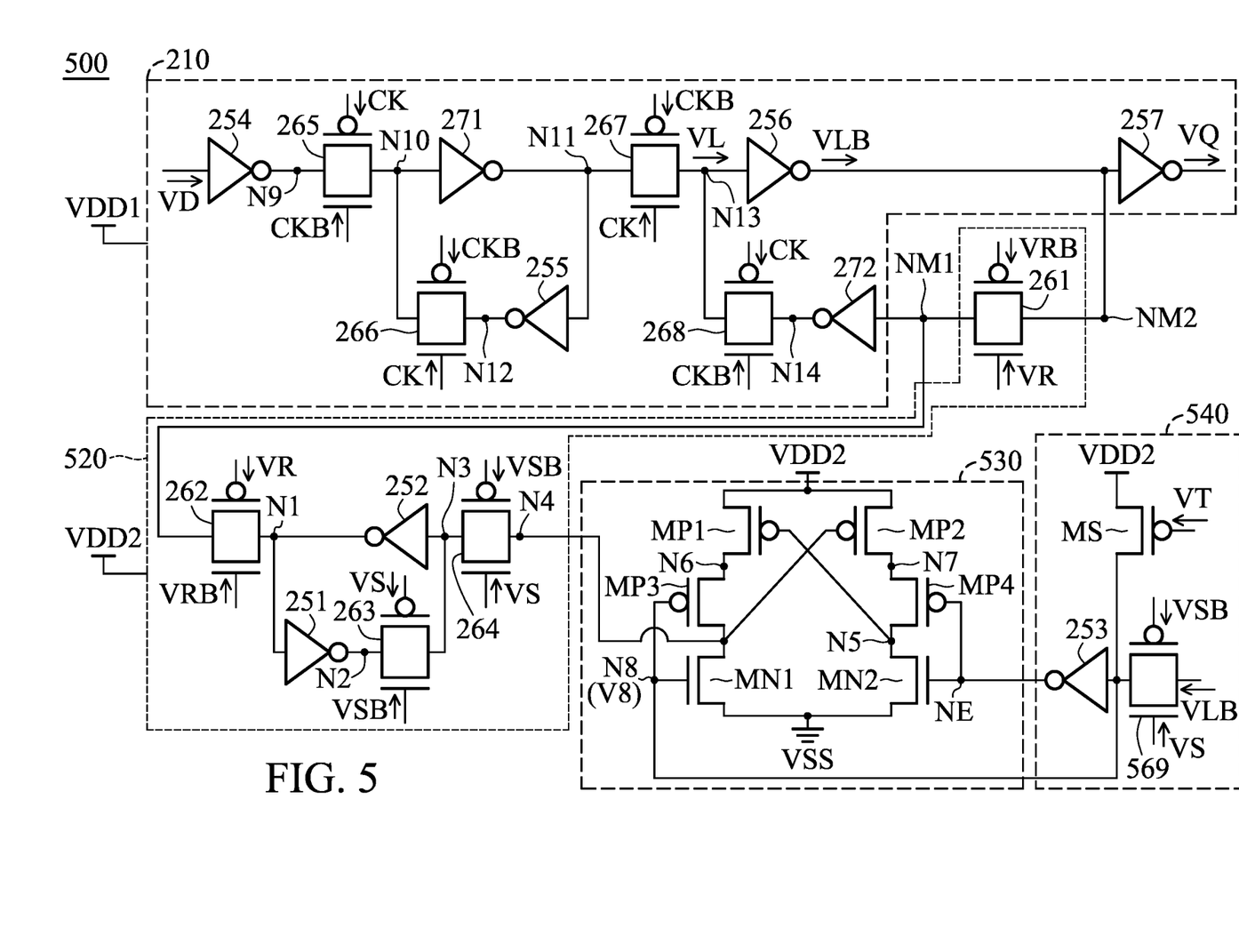
FIG. 5 is a circuit diagram of a register according another embodiment of the invention.

FIG. 5 is a circuit diagram of a register 500 according to another embodiment of the invention. In the embodiment of FIG. 5, the register 500 includes a master-slave flip-flop 210, a balloon latch 520, a level shifter 530, and an auxiliary circuit 540. The master-slave flip-flop 210 is supplied by a first power voltage VDD1. The balloon latch 520 is supplied by a second power voltage VDD2. It should be noted that the second power voltage VDD2 is independent of the first power voltage VDD1. The circuit structure and operations of the master-slave flip-flop 210 have been described in the above embodiments, and they will not be illustrate again herein.

The balloon latch 520 includes a first inverter 251, a second inverter 252, a first transmission gate 261, a second transmission gate 262, a third transmission gate 263, and a fourth transmission gate 264. The first transmission gate 261 may be open or closed, according to the restoring voltage VR. The first transmission gate 261 has a first terminal coupled to the first common node NM1, and a second terminal coupled to the second common node NM2. The second transmission gate 262 may be open or closed, according to the inverted restoring voltage VRB. The second transmission gate 262 has a first terminal coupled to the first common node NM1, and a second terminal coupled to a first node N1. The first inverter 251 has an input terminal coupled to the first node N1, and an output terminal coupled to a second node N2. The third transmission gate 263 may be open or closed, according to the inverted saving voltage VSB. The third transmission gate 263 has a first terminal coupled to the second node N2, and a second terminal coupled to a third node N3. The second inverter 252 has an input terminal coupled to the third node N3, and an output terminal coupled to the first node N1. The fourth transmission gate 264 may be open or closed, according to the saving voltage VS. The fourth transmission gate 264 has a first terminal coupled to the third node N3, and a second terminal coupled to a fourth node N4.

The level shifter 530 includes a first P-type transistor MP1, a second P-type transistor MP2, a third P-type transistor MP3, a fourth P-type transistor MP4, a first N-type transistor MN1, and a second N-type transistor MN2. The first P-type transistor MP1 has a control terminal coupled to a fifth node N5, a first terminal coupled to the second power voltage VDD2, and a second terminal coupled to a sixth node N6. The second P-type transistor MP2 has a control terminal coupled to the fourth node N4, a first terminal coupled to the second power voltage VDD2, and a second terminal coupled to a seventh node N7. The third P-type transistor MP3 has a control terminal coupled to an eighth node N8, a first terminal coupled to the sixth node N6, and a second terminal coupled to the fourth node N4. The fourth P-type transistor MP4 has a control terminal coupled to a connection node NE, a first terminal coupled to the seventh node N7, and a second terminal coupled to the fifth node N5. The first N-type transistor MN1 has a control terminal coupled to the eighth node N8, a first terminal coupled to the ground voltage VSS, and a second terminal coupled to the fourth node N4. The second N-type transistor MN2 has a control terminal coupled to the connection node NE, a first terminal coupled to the ground voltage VSS, and a second terminal coupled to the fifth node N5.

The auxiliary circuit 540 is coupled to the level shifter 530. Generally, the auxiliary circuit 540 can selectively pull up the voltage V8 at the eighth node N8 to the second power voltage VDD2. Specifically, the auxiliary circuit 540 includes a control transistor MS, a third inverter 253, and an auxiliary transmission gate 569. In some embodiments, the control transistor MS is a PMOS transistor. The control transistor MS has a control terminal for receiving an operational voltage VT, a first terminal coupled to the second power voltage VDD2, and a second terminal coupled to the eighth node N8. For example, the operational voltage VT may be the same as the saving voltage VS, the first power voltage VDD1, or the second power voltage VDD2. In alternative embodiments, the control transistor MS is replaced with another NMOS transistor, and the operational voltage VT is the same as the inverted saving voltage VSB or the ground voltage VSS. The third inverter 253 has an input terminal coupled to the eighth node N8, and an output terminal coupled to the connection node NE. The auxiliary transmission gate 569 may be open or closed, according to the saving voltage VS. The auxiliary transmission gate 569 has a first terminal coupled to the eighth node N8, and a second terminal for receiving the inverted shifting voltage VLB from the master-slave flip-flop 210. In some embodiments, the third inverter 253 in the auxiliary circuit 540 is supplied by the first power voltage VDD1, but not limited.

Similarly, the register 500 may operate in a normal mode, a saving mode, or a restoring mode, which will be described in detailed as follows.

In the normal mode, the saving voltage VS has a low logic level and the restoring voltage VR has a high logic level. Thus, the first transmission gate 261 and the third transmission gate 263 are both closed, and the second transmission gate 262, the fourth transmission gate 264, and the auxiliary transmission gate 569 are all opened. In addition, the P-type transistor MP5 is turned on to pull up the voltage V8 at the eighth node N8. The master-slave flip-flop 210 is used as a normal flip-flop.

In the saving mode, the saving voltage VS and the restoring voltage VR each have a high logic level. Thus, the first transmission gate 261, the fourth transmission gate 264, and the auxiliary transmission gate 569 are all closed, and the second transmission gate 262 and the third transmission gate 263 are both opened. In addition, the P-type transistor MP5 is turned off. At the time, a data can be read out from the master-slave flip-flop 210, and then the data can be written into the balloon latch 520. This design allows the path loading of the master-slave flip-flop 210 to be relatively low, since only the inverted shifting voltage VLB is used to operate the balloon latch 520 (without using the shifting voltage VL).

In the restoring mode, the saving voltage VS, the restoring voltage VR and the clock CK each have a low logic level. Thus, the second transmission gate 262 and the third transmission gate 263 are both closed, and the first transmission gate 261, the fourth transmission gate 264, and the auxiliary transmission gate 569 are all opened. In addition, the P-type transistor MP5 is turned on to pull up the voltage V8 at the eighth node N8. At the time, the data can be read out from balloon latch 520, and then the data can be written back into the master-slave flip-flop 210. It should be noted that in both of the normal mode and the restoring mode, the control transistor MS provides a stable input for controlling the level shifter 530. This design effectively reduces the power consumption of the level shifter 530 because the inverted saving voltage VSB (with fluctuations) from the master-slave flip-flop 210 is completely blocked by the auxiliary transmission gate 569.

Other features of the register 500 of FIG. 5 are similar to those of the register 200 of FIG. 2. Therefore, the two embodiments can achieve similar levels of performance. In alternative embodiments, the master-slave flip-flop 310 of FIG. 3 or the master-slave flip-flop 410 of FIG. 4 can also be applied to the register 500 of FIG. 5.

Figure 6:
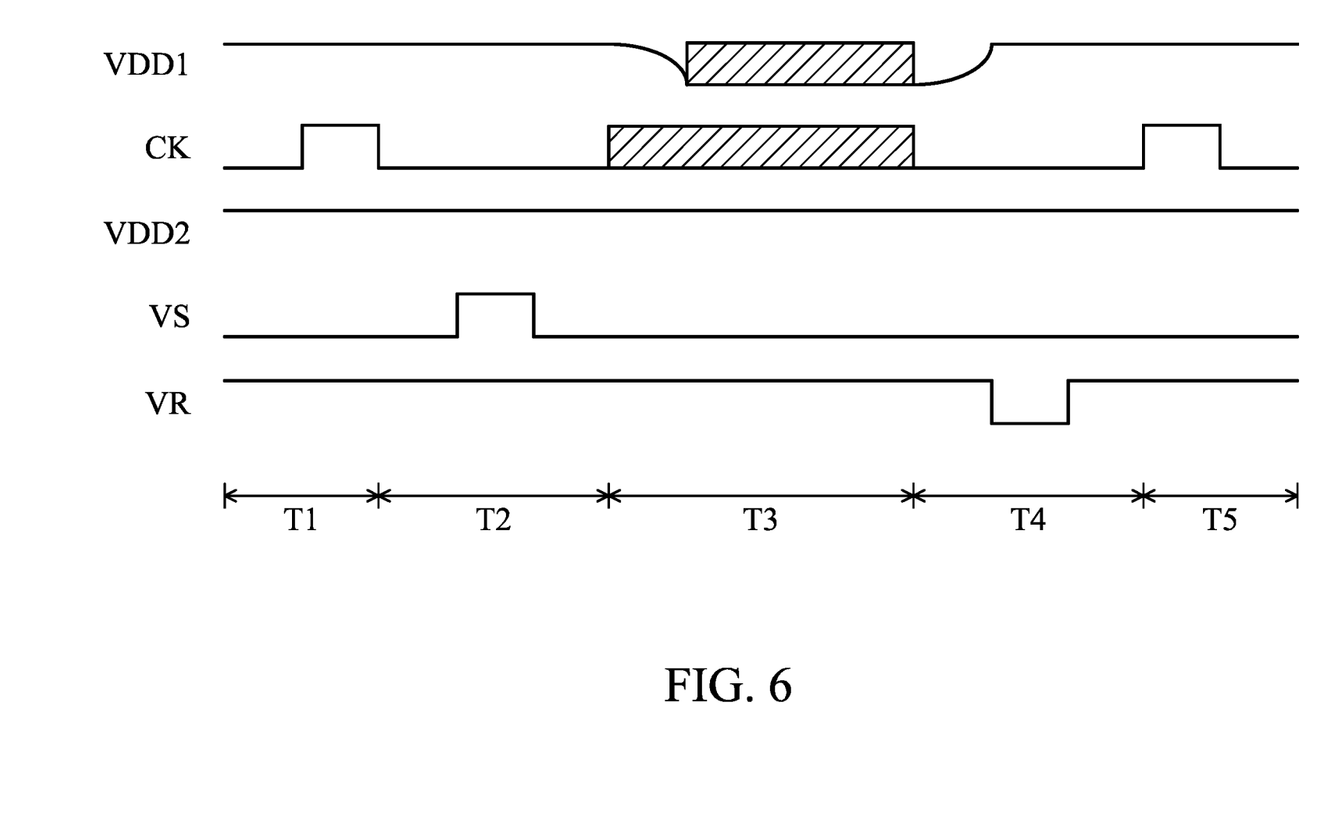
FIG. 6 is a diagram of voltage waveforms of a register according to an embodiment of the invention.

FIG. 6 is a diagram of voltage waveforms of the register 100 (or 200 or 500) according to an embodiment of the invention, where the horizontal axis represents time, and the vertical axis represents each voltage level. During a first stage T1, the register 100 operates in the normal mode, and the first power voltage VDD1 and the clock CK are enabled. During a second stage T2, the register 100 operates in the saving mode, and the saving voltage VS generates a high logic pulse, so that the data DA is transmitted from the master-slave flip-flop 110 to the balloon latch 120. During a third stage T3, the clock CK and the first power voltage VDD1 are temporarily disabled for reducing the power consumption of the whole register 100 (the shadow regions represent that no signal is entered). During a fourth stage T4, the register 100 operates in the restoring mode, and the restoring voltage VR generates a low logic pulse, so that the data DA is transmitted from the balloon latch 120 back to the master-slave flip-flop 110. During a fifth stage T5, the register 100 also operates in the normal mode, and the first power voltage VDD1 and the clock CK are enabled again.

The invention proposes a novel register. Compared to the conventional design, the invention has at least the advantages of data retention and low power consumption, and therefore it is suitable for application in a variety of electronic devices.

It should be noted that the above voltages, currents, resistances, inductances, capacitances and other element parameters are not limitations of the invention. A designer can adjust these settings according to different requirements. The register of the invention is not limited to the configurations of FIGS. 1-6. The invention may merely include any one or more features of any one or more embodiments of FIGS. 1-6. In other words, not all of the features displayed in the figures should be implemented in the register of the invention. Although the embodiments of the invention use MOSFET (Metal-Oxide-Semiconductor Field-Effect Transistor) as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A register with data retention, comprising:
   a master-slave flip-flop, supplied by a first power voltage;
   a balloon latch, supplied by a second power voltage, wherein the second power voltage is independent of the first power voltage; and
   a level shifter, providing a voltage conversion between the master-slave flip-flop and the balloon latch;
   wherein a data is stored in the master-slave flip-flop, and when the first power voltage is disabled, the balloon latch is configured to temporarily retain the data;
   wherein the balloon latch comprises:
      a first transmission gate, closed or opened according to a restoring voltage, wherein the first transmission gate has a first terminal coupled to a first common node, and a second terminal coupled to a second common node.

2. The register as claimed in claim 1, wherein the second power voltage is always enabled.

3. The register as claimed in claim 1, wherein the register operates in a normal mode, a saving mode, or a restoring mode.

4. The register as claimed in claim 3, wherein in the saving mode, the data is written into the balloon latch.

5. The register as claimed in claim 3, wherein in the restoring mode, the data is read out from the balloon latch.

6. The register as claimed in claim 3, wherein the first power voltage is temporarily disabled after the saving mode and before the restoring mode.

7. The register as claimed in claim 1, wherein the level shifter is a cross-coupling type level shifter or a current-mirror type level shifter.

8. The register as claimed in claim 1, wherein the balloon latch further comprises:
   a second transmission gate, closed or opened according to an inverted restoring voltage, wherein the second transmission gate has a first terminal coupled to the first common node, and a second terminal coupled to a first node.

9. The register as claimed in claim 8, wherein the balloon latch further comprises:
   a first inverter, wherein the first inverter has an input terminal coupled to the first node, and an output terminal coupled to a second node;
   a third transmission gate, closed or opened according to an inverted saving voltage, wherein the third transmission gate has a first terminal coupled to the second node, and a second terminal coupled to a third node;
   a second inverter, wherein the second inverter has an input terminal coupled to the third node, and an output terminal coupled to the first node; and
   a fourth transmission gate, closed or opened according to a saving voltage, wherein the fourth transmission gate has a first terminal coupled to the third node, and a second terminal coupled to a fourth node.

10. The register as claimed in claim 9, wherein the balloon latch further comprises:
   a third inverter, wherein the third inverter has an input terminal coupled to a fifth node, and an output terminal coupled to the fourth node.

11. The register as claimed in claim 10, wherein the level shifter comprises:
   a first P-type transistor, wherein the first P-type transistor has a control terminal coupled to a sixth node, a first terminal coupled to the second power voltage, and a second terminal coupled to a seventh node;
   a second P-type transistor, wherein the second P-type transistor has a control terminal coupled to the fifth node, a first terminal coupled to the second power voltage, and a second terminal coupled to an eighth node;
   a third P-type transistor, wherein the third P-type transistor has a control terminal for receiving a shifting voltage, a first terminal coupled to the seventh node, and a second terminal coupled to the fifth node;
   a fourth P-type transistor, wherein the fourth P-type transistor has a control terminal for receiving an inverted shifting voltage, a first terminal coupled to the eighth node, and a second terminal coupled to the sixth node;
   a first N-type transistor, wherein the first N-type transistor has a control terminal for receiving the shifting voltage, a first terminal coupled to a ground voltage, and a second terminal coupled to the fifth node; and
   a second N-type transistor, wherein the second N-type transistor has a control terminal for receiving the inverted shifting voltage, a first terminal coupled to the ground voltage, and a second terminal coupled to the sixth node.

12. The register as claimed in claim 9, wherein the level shifter comprises:
   a first P-type transistor, wherein the first P-type transistor has a control terminal coupled to a fifth node, a first terminal coupled to the second power voltage, and a second terminal coupled to a sixth node;
   a second P-type transistor, wherein the second P-type transistor has a control terminal coupled to the fourth node, a first terminal coupled to the second power voltage, and a second terminal coupled to a seventh node;
   a third P-type transistor, wherein the third P-type transistor has a control terminal coupled to an eighth node, a first terminal coupled to the sixth node, and a second terminal coupled to the fourth node;
   a fourth P-type transistor, wherein the fourth P-type transistor has a control terminal coupled to a connection node, a first terminal coupled to the seventh node, and a second terminal coupled to the fifth node;
   a first N-type transistor, wherein the first N-type transistor has a control terminal coupled to the eighth node, a first terminal coupled to a ground voltage, and a second terminal coupled to the fourth node; and
   a second N-type transistor, wherein the second N-type transistor has a control terminal coupled to the connection node, a first terminal coupled to the ground voltage, and a second terminal coupled to the fifth node.

13. The register as claimed in claim 12, further comprising:
   an auxiliary circuit, coupled to the level shifter, wherein the auxiliary circuit selectively pulls up a voltage at the eighth node to the second power voltage.

14. The register as claimed in claim 13, wherein the auxiliary circuit comprises:
   a control transistor, wherein the control transistor has a control terminal for receiving an operational voltage, a first terminal coupled to the second power voltage, and a second terminal coupled to the eighth node;
   a third inverter, wherein the third inverter has an input terminal coupled to the eighth node, and an output terminal coupled to the connection node; and
   an auxiliary transmission gate, closed or opened according to the saving voltage, wherein the auxiliary transmission gate has a first terminal coupled to the eighth node, and a second terminal for receiving an inverted shifting voltage.

15. The register as claimed in claim 8, wherein the master-slave flip-flop comprises:
   a fourth inverter, wherein the fourth inverter has an input terminal for receiving a data voltage, and an output terminal coupled to a ninth node;
   a fifth transmission gate, closed or opened according to an inverted clock, wherein the fifth transmission gate has a first terminal coupled to the ninth node, and a second terminal coupled to a tenth node;
   a first control inverter, wherein the first control inverter has an input terminal coupled to the tenth node, and an output terminal coupled to an eleventh node;
   a sixth transmission gate, closed or opened according to a clock, wherein the sixth transmission gate has a first terminal coupled to the tenth node, and a second terminal coupled to a twelfth node; and
   a fifth inverter, wherein the fifth inverter has an input terminal coupled to the eleventh node, and an output terminal coupled to the twelfth node.

16. The register as claimed in claim 15, wherein the master-slave flip-flop further comprises:
   a seventh transmission gate, closed or opened according to the clock, wherein the seventh transmission gate has a first terminal coupled to the eleventh node, and a second terminal coupled to a thirteenth node;
   a sixth inverter, wherein the sixth inverter has an input terminal coupled to the thirteenth node for receiving a shifting voltage, and an output terminal coupled to the second common node for outputting an inverted shifting voltage;
   an eighth transmission gate, closed or opened according to the inverted clock, wherein the eighth transmission gate has a first terminal coupled to the thirteenth node, and a second terminal coupled to a fourteenth node;
   a second control inverter, wherein the second control inverter has an input terminal coupled to the first common node, and an output terminal coupled to the fourteenth node; and
   a seventh inverter, wherein the seventh inverter has an input terminal coupled to the second common node, and an output terminal for outputting an output voltage.

17. The register as claimed in claim 8, wherein the master-slave flip-flop comprises:
   a fourth inverter, wherein the fourth inverter has an input terminal for receiving a data voltage, and an output terminal coupled to a ninth node;
   a fifth transmission gate, closed or opened according to an inverted clock, wherein the fifth transmission gate has a first terminal coupled to the ninth node, and a second terminal coupled to a tenth node;
   a first NOR gate, wherein the first NOR gate has a first input terminal for receiving a reset voltage, a second input terminal coupled to the tenth node, and an output terminal coupled to an eleventh node;

a sixth transmission gate, closed or opened according to a clock, wherein the sixth transmission gate has a first terminal coupled to the tenth node, and a second terminal coupled to a twelfth node; and a fifth inverter, wherein the fifth inverter has an input terminal coupled to the eleventh node, and an output terminal coupled to the twelfth node.

18. The register as claimed in claim 17, wherein the master-slave flip-flop further comprises:

a seventh transmission gate, closed or opened according to the clock, wherein the seventh transmission gate has a first terminal coupled to the eleventh node, and a second terminal coupled to a thirteenth node;

a sixth inverter, wherein the sixth inverter has an input terminal coupled to the thirteenth node for receiving a shifting voltage, and an output terminal coupled to the second common node for outputting an inverted shifting voltage;

an eighth transmission gate, closed or opened according to the inverted clock, wherein the eighth transmission gate has a first terminal coupled to the thirteenth node, and a second terminal coupled to a fourteenth node;

a second NOR gate, wherein the second NOR gate has a first input terminal coupled to the first common node, a second input terminal for receiving the reset voltage, and an output terminal coupled to the fourteenth node; and a seventh inverter, wherein the seventh inverter has an input terminal coupled to the second common node, and an output terminal for outputting an output voltage.

19. The register as claimed in claim 8, wherein the master-slave flip-flop comprises:

a fourth inverter, wherein the fourth inverter has an input terminal for receiving a data voltage, and an output terminal coupled to a ninth node;

a fifth transmission gate, closed or opened according to an inverted clock, wherein the fifth transmission gate has a first terminal coupled to the ninth node, and a second terminal coupled to a tenth node;

a first NAND gate, wherein the first NAND gate has a first input terminal for receiving a set voltage, a second input terminal coupled to the tenth node, and an output terminal coupled to an eleventh node;

a sixth transmission gate, closed or opened according to a clock, wherein the sixth transmission gate has a first terminal coupled to the tenth node, and a second terminal coupled to a twelfth node; and a fifth inverter, wherein the fifth inverter has an input terminal coupled to the eleventh node, and an output terminal coupled to the twelfth node.

20. The register as claimed in claim 19, wherein the master-slave flip-flop further comprises:

a seventh transmission gate, closed or opened according to the clock, wherein the seventh transmission gate has a first terminal coupled to the eleventh node, and a second terminal coupled to a thirteenth node;

a sixth inverter, wherein the sixth inverter has an input terminal coupled to the thirteenth node for receiving a shifting voltage, and an output terminal coupled to the second common node for outputting an inverted shifting voltage;

an eighth transmission gate, closed or opened according to the inverted clock, wherein the eighth transmission gate has a first terminal coupled to the thirteenth node, and a second terminal coupled to a fourteenth node;

a second NAND gate, wherein the second NAND gate has a first input terminal coupled to the first common node, a second input terminal for receiving the set voltage, and an output terminal coupled to the fourteenth node; and a seventh inverter, wherein the seventh inverter has an input terminal coupled to the second common node, and an output terminal for outputting an output voltage.

* * * * *